United States Patent
Scholl et al.

(10) Patent No.: US 6,759,625 B1
(45) Date of Patent: Jul. 6, 2004

(54) DEVICE FOR THE LASER PROCESSING OF WORKPIECES

(75) Inventors: Bernd-Friedrich Scholl, Echterdingen (DE); Lothar Müller, Heidelberg (DE); Werner Jung, Waghäusel (DE); Stefan Dietrich, Karlsruhe (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/743,892

(22) PCT Filed: Jul. 1, 1999

(86) PCT No.: PCT/DE99/01935

§ 371 (c)(1),
(2), (4) Date: Mar. 12, 2001

(87) PCT Pub. No.: WO00/03831

PCT Pub. Date: Jan. 27, 2000

(30) Foreign Application Priority Data

Jul. 13, 1998 (DE) .......................... 198 31 343

(51) Int. Cl.[7] .............................................. B23K 26/00
(52) U.S. Cl. ................................ 219/121.6; 219/121.78
(58) Field of Search ........................ 219/121.6, 121.78, 219/121.79, 121.8, 121.81, 121.82

(56) References Cited

U.S. PATENT DOCUMENTS

| 4,275,288 | A | * | 6/1981 | Makosch et al. ..... 219/121 LR |
| 4,642,439 | A | * | 2/1987 | Miller et al. .......... 219/121 LN |
| 4,652,721 | A | * | 3/1987 | Miller et al. .......... 219/121 LG |
| 4,751,365 | A | * | 6/1988 | La Rocca et al. ..... 219/121 LD |
| 4,925,620 | A | * | 5/1990 | Aiello et al. ................. 376/260 |
| 5,578,229 | A | * | 11/1996 | Barnekov et al. ....... 219/121.72 |

OTHER PUBLICATIONS

Japanese Abstract, Publication No. 03142090, Publication Date Jun. 17, 1991.
Japanese Abstract, Publication No. 03142089, Publication Date Jun. 17, 1991.
Japanese Abstract, Publication No. 60177982, Publication Date Sep. 11, 1985.

* cited by examiner

*Primary Examiner*—M. Alexandra Elve
(74) *Attorney, Agent, or Firm*—Harness, Dickey & Pierce, P.L.C.

(57) ABSTRACT

An apparatus for the laser processing of workpieces with shortened processing time. Two laser units that can be simultaneously operated are directed towards each other. Workpieces, for example printed circuit boards, are moved between the two laser units such that the two sides of the workpieces are simultaneously processed. As a result the processing time is considerably shortened.

1 Claim, 1 Drawing Sheet

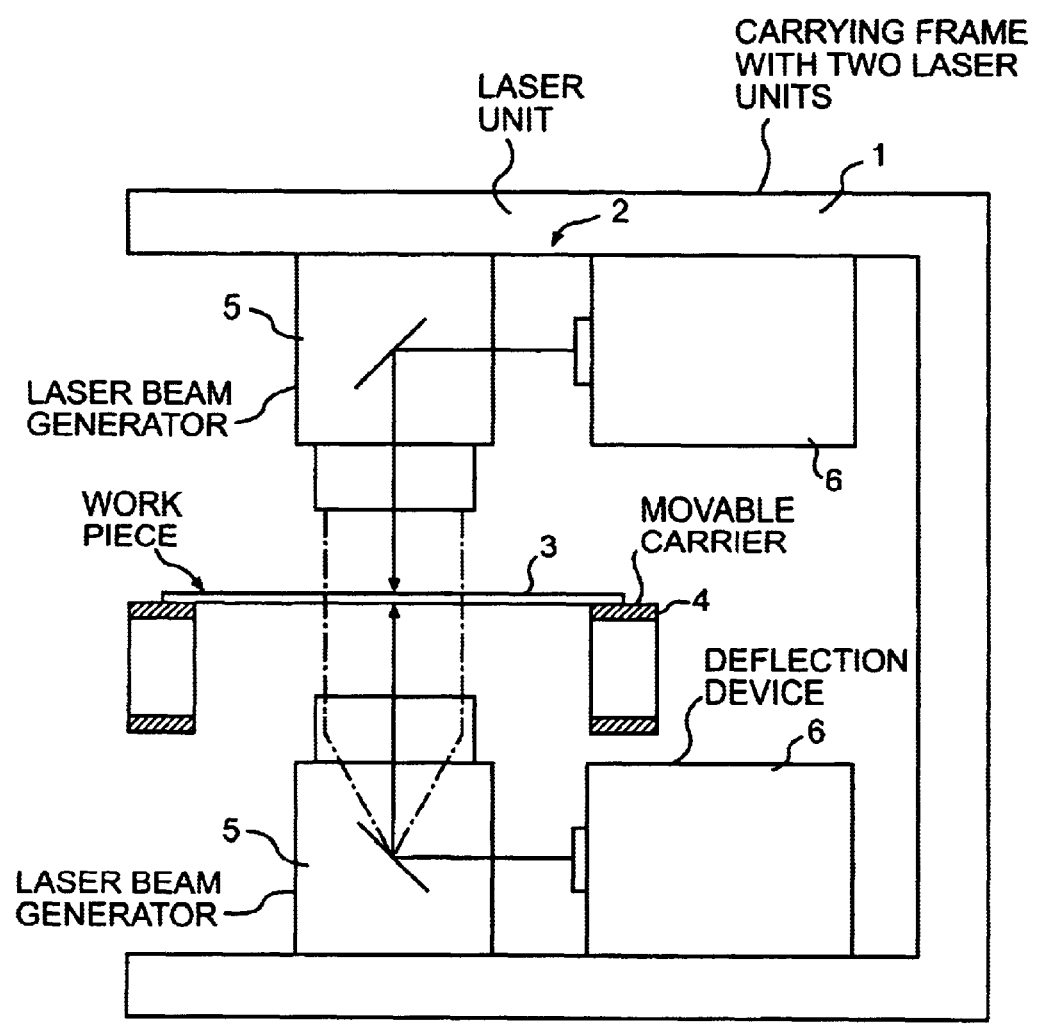

DEVICE FOR THE LASER PROCESSING OF WORKPIECES

BACKGROUND OF THE INVENTION

1. Field of the Invention

The invention is directed to an apparatus for the laser processing of workpieces having processing surfaces lying diametrically opposite one another.

2. Description of the Prior Art

In the manufacture of fine surface structures, for example in printed circuit boards, it is known to structure conductive or cover layers with high precision using a laser beam. Given printed circuit boards laminated on both sides, the printed circuit board must be turned over and be brought into the working range of the laser unit a second time.

U.S. Pat. No. 5,678,229 A has disclosed a laser cutting means for plates, whereby the workpiece is arranged between two laser units directed toward one another and whose optical axes are exactly aligned with one another, so that the displaceable guided plates can be given a clean parting cut.

JP 03142090 A has also discloses a laser drilling means for printed circuit boards, whereby the holes are generated by two laser devices whose laser beams given via fixed deflection mirrors likewise have their optical axes exactly aligned with one another. The printed circuit board must be correspondingly shifted for drilling other holes.

Similarly, JP 60177982 has disclosed a similar device for the simultaneous and both-sided marking of plates, whereby, however, the laser beams are adjusted relative to one another from both sides via a beam splitter and multiple, fixed deflection mirrors.

SUMMARY OF THE INVENTION

The invention is based on the object of enhancing the processing precision and shortening the processing duration.

This object is achieved by the invention where two laser units are directed toward one another. These units can be simultaneously operated. Each unit has a deflection device that deflects the laser beam to cover the area of the workpiece to be processed at any time. Since the two laser units can be controlled independently of one another, different patterns can be generated on the two sides without having to move the printed circuit board, as a result whereof the processing time is cut in half. Moreover, the turnover, change and adjustment outlay for processing the second printed circuit board side is eliminated. The position of the workpiece need only be acquired once. The two laser units can be pre-adjusted such that the processing patterns at both sides of the printed circuit board are congruent without differences.

In another embodiment of the present invention, different structures can be produced on the two sides of the printed circuit board without employing masks.

DESCRIPTION OF THE DRAWINGS

The illustrated FIGURE shows a schematic side view of a carrying frame 1 with two laser units 1, a workpiece 3 fashioned as printed circuit board and a movable carrier 4 fashioned as linear transport means whose transport direction proceeds perpendicular to the plane of the FIGURE.

DETAILED DESCRIPTION OF THE PREFERRED EMBODIMENTS

The laser unit 2 is composed of a laser beam generator 5 and of a deflection device 6 with which the laser beam can be deflected such in two coordinate directions that it is respectively perpendicular to the workpiece surface. The two laser units are arranged such above and below the workpiece 3 that their emitted beams are directed opposite one another. Both surfaces of the workpiece 3 cover the radiation region. These surfaces can then be simultaneously processed and be subsequently moved to such an extent by the movable carrier 4 that another processing area of the printed circuit board proceeds into the radiation region of the laser unit 2 or until the workpiece 3 has left the laser region.

The workpiece can, for example, be fashioned as normal printed circuit board wherein individual regions must be especially finely structured. However, it is also possible, for example, the employ a conductive film instead of the printed circuit board and to pull this past between the two deflection device 6 in steps. The workpieces 3 can also, for example, be fashioned as relatively small chip carriers and be fixed in a plurality of receptacles of a workpiece carrier that is provided with corresponding clearances for the passage of laser beams. In this case, the carrier 4 seizes the workpiece carrier and guides it such that the individual workpieces successively proceed into the laser beam region.

Although other modifications and changes may be suggested by those skilled in the art, it is the intention of the inventors to embody within the patent warranted hereon all changes and modifications as reasonably and properly come within the scope of their contribution to the art.

We claim:

1. An apparatus for laser processing of plate-like interconnect carriers laminated on both sides, said apparatus comprising:

two laser units directed towards one another, said laser units being capable of simultaneous operation, said carriers placed between the two laser units;

an internal beam deflection device for each of said two laser units, said internal deflection device to deflect respective substantially perpendicular laser beams emitted from said laser units on to regions of said carriers to be processed; and a movable carrier for moving said carriers in to a radiation region of said laser units, said carriers being fixed to said movable carrier.

* * * * *